(12) United States Patent
Leobandung

(10) Patent No.: US 10,014,372 B1
(45) Date of Patent: Jul. 3, 2018

(54) VERTICAL GATE-ALL-AROUND TRANSISTOR WITH TOP AND BOTTOM SOURCE/DRAIN EPITAXY ON A REPLACEMENT NANOWIRE, AND METHOD OF MANUFACTURING THE SAME

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/399,064

(22) Filed: Jan. 5, 2017

(51) Int. Cl.
*H01L 29/06* (2006.01)
*H01L 29/423* (2006.01)
(Continued)

(52) U.S. Cl.
CPC .... *H01L 29/0676* (2013.01); *H01L 21/02381* (2013.01); *H01L 21/2258* (2013.01);
(Continued)

(58) Field of Classification Search
CPC .......... H01L 21/02381; H01L 21/2258; H01L 21/32133; H01L 21/823487; H01L 21/823437; H01L 21/823456; H01L 21/823475; H01L 21/823481; H01L 27/088; H01L 29/0657; H01L 29/0665; H01L 29/0669; H01L 29/068; H01L 29/0676; H01L 29/0847; H01L 29/1037; H01L 29/20; H01L 29/4232; H01L 29/42372; H01L 29/42376; H01L 29/42392; H01L 29/42356; H01L 29/66522; H01L 29/6653; H01L 29/66545; H01L 29/66666; H01L 29/78642; H01L 29/7834; H01L 29/66787; H01L 29/66712–29/66734;
(Continued)

(56) References Cited

U.S. PATENT DOCUMENTS 9,502,265 B1 * 11/2016 Henry ............... H01L 21/31155
9,525,064 B1 * 12/2016 Balakrishnan ...... H01L 29/7827
(Continued)

*Primary Examiner* — Marc Armand
*Assistant Examiner* — Younes Boulghassoul
(74) *Attorney, Agent, or Firm* — Scully, Scott, Murphy & Presser, P.C.; Louis J. Percello, Esq.

(57) ABSTRACT

After providing a Group IV semiconductor nanowire on a substrate, a sacrificial material portion is formed on sidewalls of a bottom portion of the Group IV semiconductor nanowire. A sacrificial gate layer is then formed over the sacrificial material portion to laterally surround a middle portion of the Group IV semiconductor nanowire, followed by forming a sacrificial spacer on sidewalls of a remaining top portion of the Group IV semiconductor nanowire. After replacing the Group IV semiconductor nanowire with a Group III-V compound semiconductor nanowire, the sacrificial material portion, sacrificial spacer and sacrificial gate layer are replaced by a first epitaxial semiconductor region which serves as a bottom source/drain region, a second epitaxial semiconductor region which serves as a top source/drain region, and a functional gate structure, respectively.

20 Claims, 9 Drawing Sheets

(51) Int. Cl.
    *H01L 21/8234* (2006.01)
    *H01L 29/08* (2006.01)
    *H01L 29/10* (2006.01)
    *H01L 29/20* (2006.01)
    *H01L 27/088* (2006.01)
    *H01L 29/78* (2006.01)
    *H01L 29/66* (2006.01)
    *H01L 21/02* (2006.01)
    *H01L 21/3213* (2006.01)
    *H01L 21/225* (2006.01)

(52) U.S. Cl.
    CPC .............. *H01L 21/32133* (2013.01); *H01L 21/823487* (2013.01); *H01L 27/088* (2013.01); *H01L 29/0847* (2013.01); *H01L 29/1037* (2013.01); *H01L 29/20* (2013.01); *H01L 29/42356* (2013.01); *H01L 29/42392* (2013.01); *H01L 29/6653* (2013.01); *H01L 29/66522* (2013.01); *H01L 29/66545* (2013.01); *H01L 29/66666* (2013.01); *H01L 29/7827* (2013.01)

(58) Field of Classification Search
    CPC .................. H01L 29/7802–29/7815; H01L 29/7827–29/7828; H01L 51/057
    See application file for complete search history.

(56) References Cited

U.S. PATENT DOCUMENTS

| | | | |
|---|---|---|---|
| 9,607,899 B1* | 3/2017 | Cheng | H01L 21/823487 |
| 9,640,636 B1* | 5/2017 | Bentley | H01L 29/66666 |
| 2016/0064541 A1* | 3/2016 | Diaz | H01L 29/66666 |
| | | | 257/329 |
| 2016/0240623 A1* | 8/2016 | Chang | B82Y 10/00 |
| 2017/0222045 A1* | 8/2017 | Leobandung | H01L 23/49575 |
| 2017/0352742 A1* | 12/2017 | Cheng | H01L 29/66666 |

* cited by examiner

VERTICAL GATE-ALL-AROUND TRANSISTOR WITH TOP AND BOTTOM SOURCE/DRAIN EPITAXY ON A REPLACEMENT NANOWIRE, AND METHOD OF MANUFACTURING THE SAME

BACKGROUND

The present application relates to semiconductor device fabrication, and more particularly, to the fabrication of vertical field effect transistors (FETs).

Field effect transistors (FETs) are typically formed on a substrate and include a channel region disposed between source and drain regions, and a gate configured to electrically connect the source region and the drain region through the channel region. FETs can be classified into horizontal architectures and vertical architectures. A horizontal FET has a channel region parallel to the horizontal surface of the substrate, while a vertical FET has a channel region perpendicular to the main surface of the substrate. Thus, in a vertical FET, the direction of the current flow between the source region and the drain region is normal to the main surface of the substrate. By employing a vertical device configuration, it is possible to increase packing density. Vertical FETs thus can potentially extend scaling.

Group III-V compound semiconductors possess high electron mobility and are suitable for n-type FETs. Group III-V compound semiconductor nanowires can be grown vertically from a semiconductor substrate, which makes them a good candidate for vertical FETs. However, since a high temperature epitaxy process is needed for formation of the source region and the drain region for p-type FETs, it would be desirable to grow Group III-V compound semiconductor nanowires after the high temperature source/drain epitaxy process has been performed for construction of n-type FETs.

SUMMARY

The present application provides a processing scheme for forming n-type vertical FETs containing Group III-V compound semiconductor nanowires. The Group III-V compound semiconductor nanowires are formed by replacing Group IV semiconductor nanowires after middle-of-line processing has been performed.

According to an aspect of the present application, a semiconductor structure is provided. The semiconductor structure includes a semiconductor nanowire extending upwards from a semiconductor substrate portion, a bottom source/drain region including a first doped region located within a bottom portion of the semiconductor nanowire and a first epitaxial semiconductor region having a horizontal portion present on the semiconductor substrate portion and a vertical portion present on sidewalls of the first doped region, a top source/drain region including a second doped region located within a top portion of the semiconductor nanowire and a second epitaxial semiconductor region present on sidewalls of the second doped region, a channel region located within the semiconductor nanowire and between the first doped region and the second doped region, and a functional gate structure laterally surrounding the channel region.

According to another aspect of the present application, a method of forming a semiconductor structure is provided. The method includes forming a sacrificial semiconductor nanowire extending upwards from a semiconductor substrate portion. A sacrificial material layer is then formed over physically exposed surfaces of the sacrificial semiconductor nanowire and the semiconductor substrate portion. Next, an insulator layer is formed over the sacrificial material layer. The insulator layer has a topmost surface located below a topmost surface of the sacrificial semiconductor nanowire. After removing portions of the sacrificial material layer that are not covered by the insulator layer to provide a sacrificial material portion laterally surrounding a bottom portion of the sacrificial semiconductor nanowire, a sacrificial gate layer is formed over the insulator layer and the sacrificial material portion. Next, a sacrificial spacer is formed on sidewalls of a top portion the sacrificial semiconductor nanowire that is not covered by the sacrificial gate layer and the sacrificial material layer. An interlevel dielectric (ILD) layer is subsequently formed over the sacrificial gate layer to laterally surround the sacrificial spacer. The sacrificial semiconductor nanowire is then replaced with a semiconductor nanowire. Next, after removing the sacrificial material portion and the sacrificial spacer to expose sidewalls of the bottom portion and sidewalls of the top portion of the semiconductor nanowire, a first epitaxial semiconductor region is formed laterally surrounding the sidewalls of the bottom portion of the semiconductor nanowire and a second epitaxial semiconductor region is formed laterally surrounding the sidewalls of the top portion of the semiconductor nanowire. Next, the sacrificial gate layer is removed to provide a gate cavity exposing a channel region of the semiconductor nanowire. A functional gate structure is then formed within the gate cavity.

DETAILED DESCRIPTION

Figure 1:
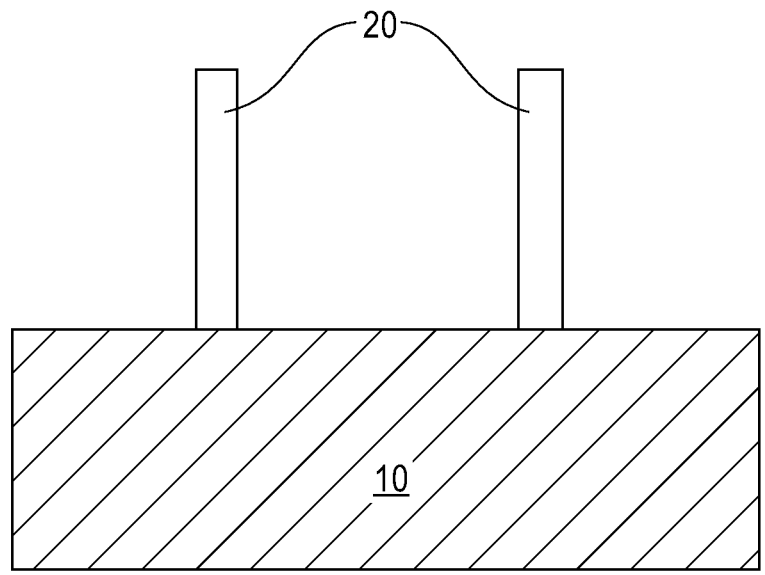
FIG. 1 is a cross-sectional view of an exemplary semiconductor structure including a plurality of Group IV semiconductor nanowires extending upwards from a semiconductor substrate portion according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring now to FIG. 1, there is illustrated an exemplary semiconductor structure including a plurality of Group IV semiconductor nanowires 20 extending upwards from a remaining portion of a semiconductor substrate (herein referred to as semiconductor substrate portion 10) that can be employed according to an embodiment of the present application.

The exemplary semiconductor structure shown in FIG. 1 can be formed by first providing a semiconductor substrate (not shown). The semiconductor substrate that can be used in the present application is a bulk semiconductor substrate. By "bulk" semiconductor substrate, it is meant a substrate that is entirely composed of at least one semiconductor material that has semiconducting properties. In the present application, at least an upper semiconductor material portion of the bulk semiconductor substrate is composed of at least one Group IV semiconductor element such as, for example, silicon (Si), germanium (Ge), silicon germanium alloys (SiGe), carbon doped silicon (Si:C) and silicon germanium carbide (SiGeC). In one embodiment, the semiconductor substrate is composed entirely of silicon.

The at least one semiconductor material that provides the semiconductor substrate may be single crystalline, polycrystalline or amorphous. In one example, the entirety of, or at least a topmost portion of, the semiconductor substrate is composed of a single crystalline semiconductor material such as, for example, single crystalline silicon. In one embodiment, the semiconductor substrate has a (111) crystalline orientation.

After providing the semiconductor substrate, the semiconductor substrate is then patterned to provide the exemplary semiconductor structure shown in FIG. 1. In the present application, each Group IV semiconductor nanowire 20 is formed within an upper semiconductor material portion of the semiconductor substrate, while the semiconductor substrate portion 10 represents a remaining lower semiconductor material portion of the semiconductor substrate. As used herein, a "semiconductor nanowire" refers to a remaining portion of the semiconductor substrate and includes a semiconductor material portion having an elongated dimension along one direction and having dimensions not exceeding 1,000 nm along directions perpendicular to the elongated dimension. In one embodiment of the present application, each Group IV semiconductor nanowire 20 has a width from 5 nm to 30 nm, although lesser and greater widths can also be employed. The height of each Group IV semiconductor nanowire 20 can be from 20 nm to 200 nm, although lesser and greater heights can also be employed. Each Group IV semiconductor nanowire 20 is spaced apart from its nearest neighboring Group IV semiconductor nanowire 20 by a distance. In one embodiment, the distance between neighboring Group IV semiconductor nanowires 20 can be from 20 nm to 100 nm. Also, Group IV semiconductor nanowires 20 are oriented parallel to each other.

The Group IV semiconductor nanowires 20 can be formed by patterning an upper portion of the semiconductor substrate. In one embodiment of the present application, the patterning used to provide the plurality Group IV semiconductor nanowires 20 may include lithography and etching. Lithography includes forming a photoresist layer (not shown) atop the semiconductor substrate. The photoresist layer may include a positive-tone photoresist material, a negative-tone photoresist material or a hybrid-tone photoresist material. The photoresist layer may be formed by a deposition process such as, for example, spin coating. After forming the photoresist layer, the photoresist layer is subjected to a pattern of irradiation. Next, the exposed photoresist layer is developed utilizing a conventional resist developer. This provides a patterned photoresist layer atop the semiconductor substrate to be patterned. The pattern provided by the patterned photoresist layer is thereafter transferred into the underlying semiconductor substrate utilizing at least one pattern transfer etching process. Typically, the at least one pattern transfer etching process is an anisotropic etch. In one embodiment, a dry etch such as, for example, reactive ion etching (RIE) can be used. In another embodiment, a wet etch utilizing chemical etchant can be used. In still a further embodiment, a combination of dry etch and wet etch can be used. In the illustrated embodiment, the etch stops within a portion of the semiconductor substrate.

In another embodiment of the present application, the patterning used to provide the plurality of Group IV semiconductor nanowires 20 may include a sidewall image transfer (SIT) process. The SIT process includes forming a mandrel material layer (not shown) atop the semiconductor substrate to be patterned. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal such as, for example, Al, W, or Cu. The mandrel material layer can be formed, for example, by chemical vapor deposition (CVD) or plasma enhanced chemical vapor deposition (PECVD). Following deposition of the mandrel material layer, the mandrel material layer can be patterned by lithography and etching to form a plurality of mandrel structures (also not shown) on the topmost surface of the semiconductor substrate.

The SIT process continues by forming a spacer on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in depositing the spacer material include, for example, CVD, PECVD or atomic layer deposition (ALD). Examples of etching that be used in providing the spacers include any etching process such as, for example, RIE.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying semiconductor substrate. The pattern transfer may be achieved by utilizing at least one etching process. Examples of etching processes that can used to transfer the pattern may include dry etch (i.e., RIE, plasma etching, ion beam etching or laser ablation) and/or wet etch. In one example, the etching process used to transfer the pattern may include one or more RIE steps. Upon completion of the pattern transfer, the SIT process concludes by removing the spacers from the structure. Each spacer may be removed by etching or a planarization process.

After formation of the Group IV semiconductor nanowires 20, the Group IV semiconductor nanowires 20 can be further shaped and thinned beyond the dimensions at which they can be fabricated by additional lithography and etching. This can be achieved by processes such as, for example, thermal oxidation, etching and hydrogen annealing at elevated temperatures. Ultimately, the Group IV semiconductor nanowires 20 may have circular, ovoid, square, hexagonal or octagonal cross-sections.

Figure 2:
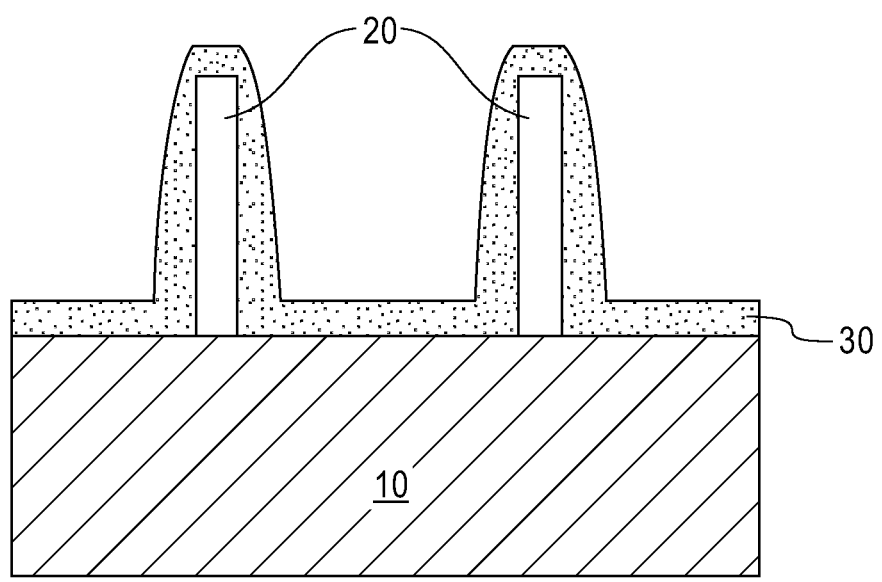
FIG. 2 is a cross-sectional view of the exemplary semiconductor structure of FIG. 1 after forming a sacrificial material layer over the physically exposed surfaces of the Group IV semiconductor nanowires and semiconductor substrate portion.

Referring now to FIG. 2, there is illustrated the exemplary semiconductor structure of FIG. 1 after forming a conformal sacrificial material layer 30 on physically exposed surfaces (i.e., topmost surfaces and sidewall surfaces) of the Group IV semiconductor nanowires 20 and topmost surfaces of portions of the semiconductor substrate portion 10 that are not covered by the Group IV semiconductor nanowires 20. The sacrificial material layer 30 may include a dielectric nitride. In one embodiment, the sacrificial material layer 30 is composed of silicon nitride. The sacrificial material layer 30 can be formed utilizing a deposition process such as, for example, CVD or ALD. The thickness of the sacrificial material layer 30 can be from 10 nm to 50 nm, although lesser and greater thicknesses can also be employed.

Figure 3:
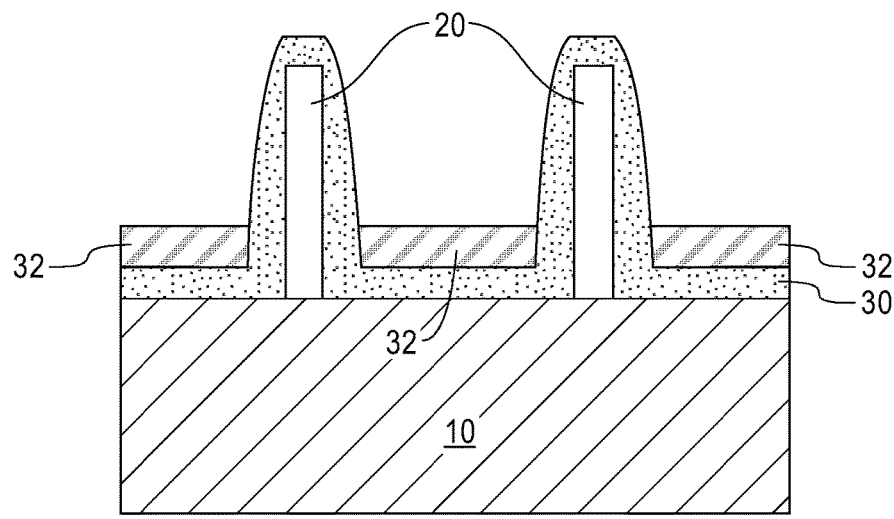
FIG. 3 is a cross-sectional view of the exemplary semiconductor structure of FIG. 2 after forming an insulator layer over the sacrificial material layer.

Referring now to FIG. 3, there is illustrated the exemplary semiconductor structure of FIG. 2 after forming an insulator layer 32 on the sacrificial material layer 30. The insulator layer 32 has a topmost surface that is vertically offset and located beneath a topmost surface of each Group IV semiconductor nanowire 20. The insulator layer 32 thus is present on a horizontal portion of the sacrificial material layer 30 that is located on the semiconductor substrate portion 10 and on a bottom portion of each vertical portion of the sacrificial material layer 30 located on each sidewall surface of each Group IV semiconductor nanowire 20.

The insulator layer 32 may include a dielectric material having a different etch selectivity with respect to the dielectric material that provides the sacrificial material layer 30. In one embodiment, the insulator layer 32 includes a low-k dielectric material having a dielectric constant that is less than 4.0. Exemplary low-k dielectric materials that can be employed in the insulator layer 32 include, but are not limited to, boron nitride, silicon carbon boron nitride and a low deposition temperature oxide (e.g., <400° C.). In one embodiment, the insulator layer 32 is composed of boron nitride.

The insulator layer 32 can be formed by depositing a dielectric material over the sacrificial material layer 30 using a deposition process such as, for example, CVD or PVD, planarizing the deposited dielectric martial by a planarization process such as, for example, chemical mechanical planarization (CMP), and then etching back the planarized dielectric material to the desired thickness. An anisotropic etching process such as, for example, RIE may be employed to etch the dielectric material that provides the insulator layer 32 selective to the dielectric material that provides the sacrificial material layer 30. The thickness of the insulator layer 32 can be from 5 nm to 20 nm, although lesser and greater thicknesses can also be employed.

Figure 4:
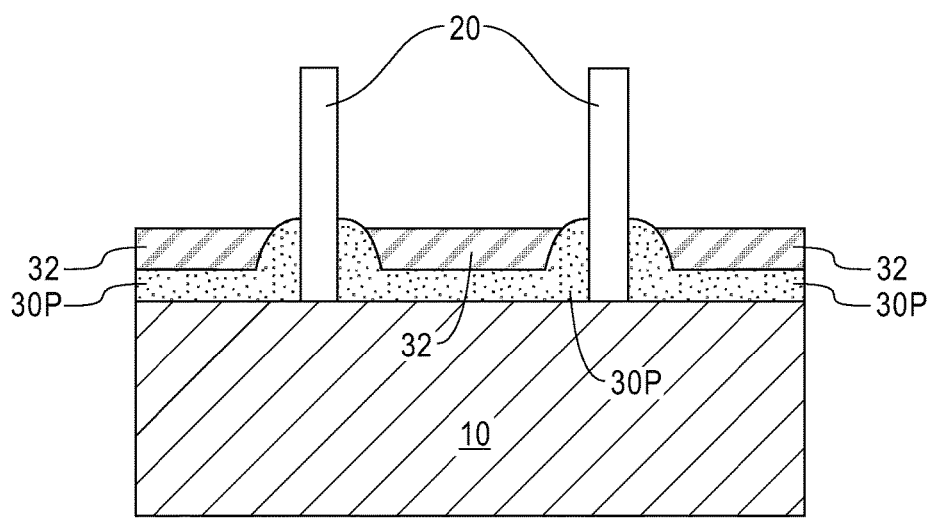
FIG. 4 is a cross-sectional view of the exemplary semiconductor structure of FIG. 3 after removing physically exposed portions of the sacrificial material layer that are not covered by the insulator layer to provide a sacrificial material portion.

Referring now to FIG. 4, there is illustrated the exemplary semiconductor structure of FIG. 3 after removing physically exposed portions of the sacrificial material layer 30 that are not covered by the insulator layer 32. The physically exposed portions of the sacrificial material layer 30 can be removed by an etch, which can be an isotropic etch or an anisotropic etch. The etch chemistry employed to etch the sacrificial material layer 30 can be selected to avoid damaging the dielectric material that provides the insulator layer 32 and the semiconductor material that provides each Group IV semiconductor nanowire 20. In one embodiment, the physically exposed portions of the sacrificial material layer 30 can be removed by RIE. The removal of the physically exposed portions of the sacrificial material layer 30 re-exposed the topmost surface and sidewall surfaces of an upper portion of each Group IV semiconductor nanowire 20. A remaining portion of the sacrificial material layer 30 is herein referred to as a sacrificial material portion 30P. The sacrificial material portion 30P includes a horizontal portion present on the semiconductor substrate portion 10 and a vertical portion present on each sidewall of each bottom portion of each Group IV semiconductor nanowire 20. In one embodiment, the topmost surface of each vertical portion of the sacrificial material portion 30P is coplanar with the topmost surface of the insulator layer 32.

Figure 5:
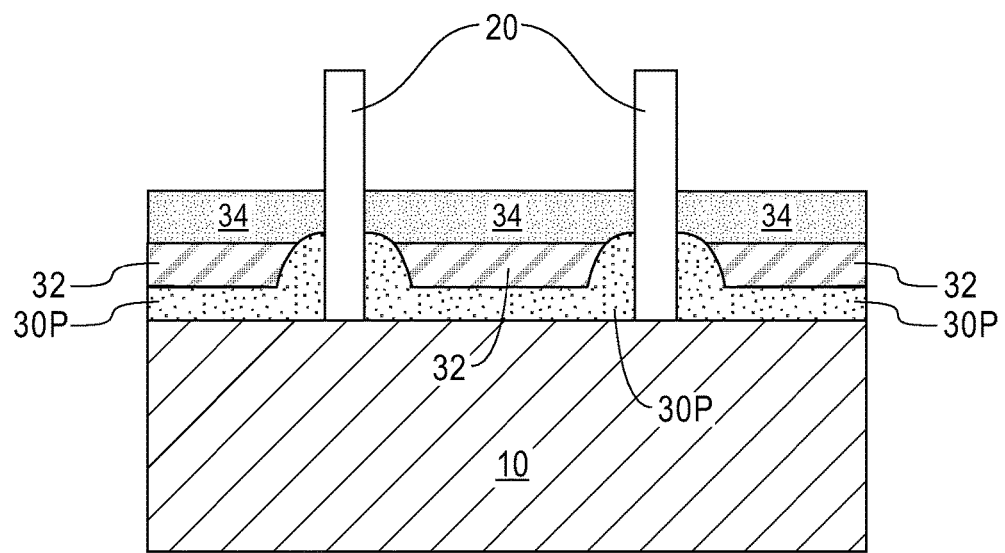
FIG. 5 is a cross-sectional view of the exemplary semiconductor structure of FIG. 4 after forming a sacrificial gate layer over the insulator layer and the sacrificial material portion.

Referring now to FIG. 5, there is illustrated the exemplary semiconductor structure of FIG. 4 after forming a sacrificial gate layer 34 over the insulator layer 32 and the sacrificial material portion 30P. The sacrificial gate layer 34 may include a dielectric material that can be selectively removed with respect to the dielectric material that provides the insulator layer 32. For example, the sacrificial gate layer 34 may include a dielectric metal oxide or a dielectric oxide. In one embodiment, the sacrificial gate layer 34 includes silicon dioxide.

The sacrificial gate layer 34 can be formed by deposition of a dielectric material utilizing a conventional deposition process including, but not limited to, CVD, PECVD or PVD. Subsequently, the deposited dielectric material is planarized, for example, by CMP, and recessed by a recess etch. The etch can be a dry etch or a wet etch that removes the dielectric material that provides the sacrificial gate layer 34 selective to the semiconductor material that provides each Group IV semiconductor nanowire 20. The topmost surface of the sacrificial gate layer 34 is vertically offset and located below the topmost surface of each Group IV semiconductor nanowire 20.

Figure 6:
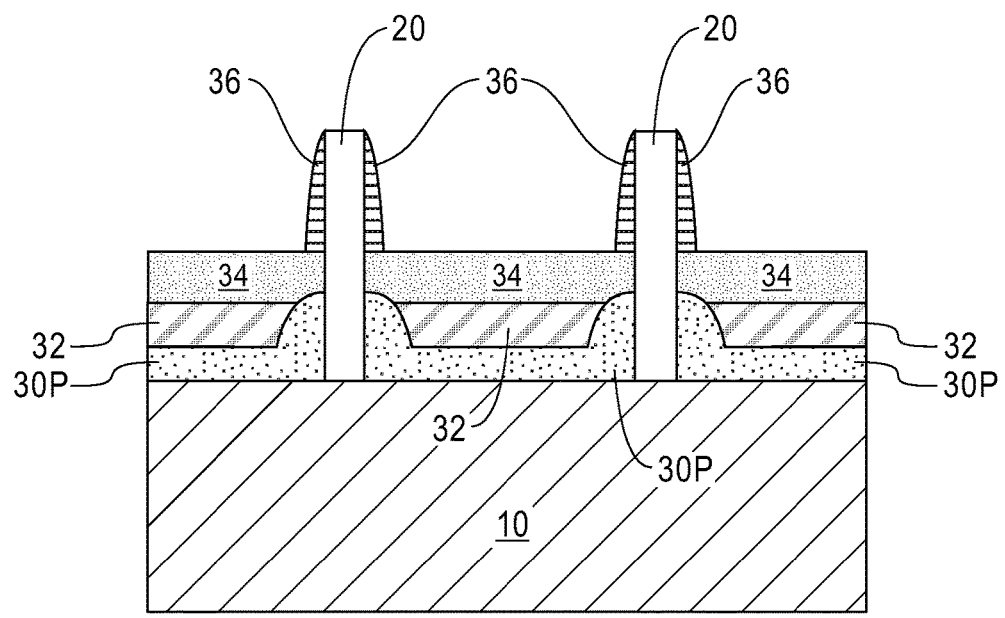
FIG. 6 is a cross-sectional view of the exemplary semiconductor structure of FIG. 5 after forming a sacrificial spacer on physically exposed sidewall surfaces of each Group IV semiconductor nanowire.

Referring now to FIG. 6, there is illustrated the exemplary semiconductor structure of FIG. 5 after forming a sacrificial spacer 36 on physically exposed sidewall surfaces of each Group IV semiconductor nanowire 20. The sacrificial spacer 36 may include a dielectric material the same as, or different from, the dielectric material that provides the sacrificial material portion 30P. In one embodiment, each of the sacrificial spacer 36 and the sacrificial material portion 30P is composed of silicon nitride.

The sacrificial spacer 36 can be formed by conformally depositing a sacrificial spacer material (not shown) on the physically exposed surfaces of the sacrificial gate layer 34 and each Group IV semiconductor nanowire 20 utilizing CVD or ALD. Horizontal portions of the deposited sacrificial spacer material are subsequently removed from the topmost surfaces of the sacrificial gate layer 34 and each Group IV semiconductor nanowire 20, for example, by an anisotropic etch. The anisotropic etch can be a dry etch such as, for example, RIE or a wet etch that removes sacrificial spacer material selective to the semiconductor material that provides each Group IV semiconductor nanowire 20 and the dielectric material that provides the sacrificial gate layer 34. After etch, a remaining vertical portion of the deposited sacrificial spacer material on sidewall surfaces of each Group IV semiconductor nanowire 20 constitutes the sacrificial spacer 36. The width of each sacrificial spacer 36, as measured from its base, can be from 5 nm to 50 nm, although lesser and greater widths can also be employed.

Figure 7:
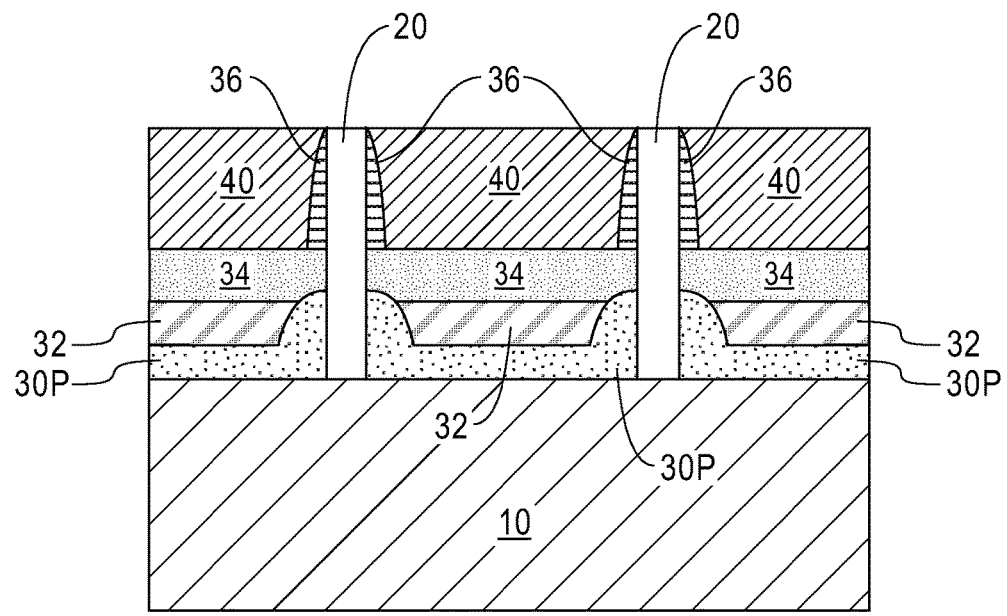
FIG. 7 is a cross-sectional view of the exemplary semiconductor structure of FIG. 6 after forming an interlevel dielectric (ILD) layer over the sacrificial gate layer.

Referring now to FIG. 7, there is illustrated the exemplary semiconductor structure of FIG. 6 after forming an interlevel dielectric (ILD) layer 40 over the sacrificial gate layer 34. The ILD layer 40 laterally surrounds each sacrificial spacer 36. The ILD layer 40 may include a dielectric material the same as, or different from, the dielectric material that provides the insulator layer 32. For example, the ILD layer 40 may include a low-k dielectric material such as boron nitride, silicon carbon boron nitride or a low deposition temperature oxide. In one embodiment, the ILD layer 40 is composed of boron nitride. The ILD layer 40 can be formed by CVD, PVD or spin coating. The ILD layer 40 can be initially formed such that an entirety of the topmost surface of the ILD layer 40 is formed above the topmost surface of each Group IV semiconductor nanowire 20. The ILD layer 40 can be subsequently planarized, for example, by CMP and/or a recess etch using each Group IV semiconductor nanowire 20 as a polishing and/or an etch stop. After planarization, the topmost surface of the ILD layer 40 is coplanar with the topmost surface of each Group IV semiconductor nanowire 20.

Figure 8:
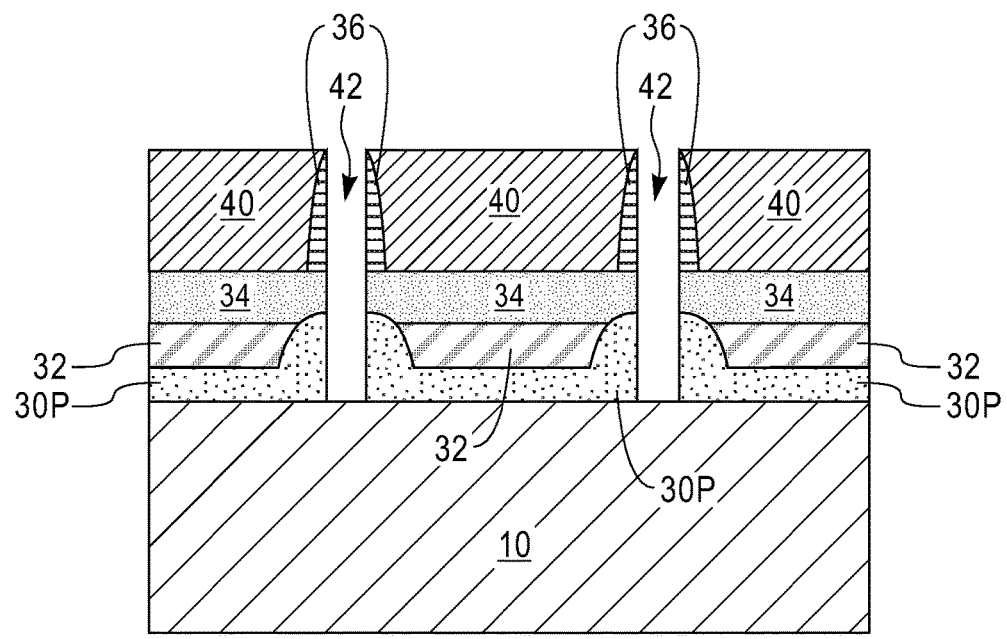
FIG. 8 is a cross-sectional view of the exemplary semiconductor structure of FIG. 7 after removing each Group IV semiconductor nanowire to provide a cavity exposing a surface of the semiconductor substrate portion.

Referring now to FIG. 8, there is illustrated the exemplary semiconductor structure of FIG. 7 after removing each Group IV semiconductor nanowire 20. Each Group IV semiconductor nanowire 20 can be removed utilizing an anisotropic etch that is selective in removing the semiconductor material that provides each Group IV semiconductor nanowire 20 relative to the dielectric materials that provide the sacrificial spacer 36, the sacrificial gate layer 34, the insulator layer 32 and the sacrificial material portion 30P. The anisotropic etch can be a dry etch such as, for example, RIE or a wet etch. In one embodiment and when each Group IV semiconductor nanowire 20 is composed of silicon, the silicon nanowire may be removed utilizing HCl gas or by RIE. A cavity 42 is thus formed occupying an area from which a Group IV semiconductor nanowire 20 is removed. Each cavity 42 exposes a topmost surface of the semiconductor substrate portion 10.

Figure 9:
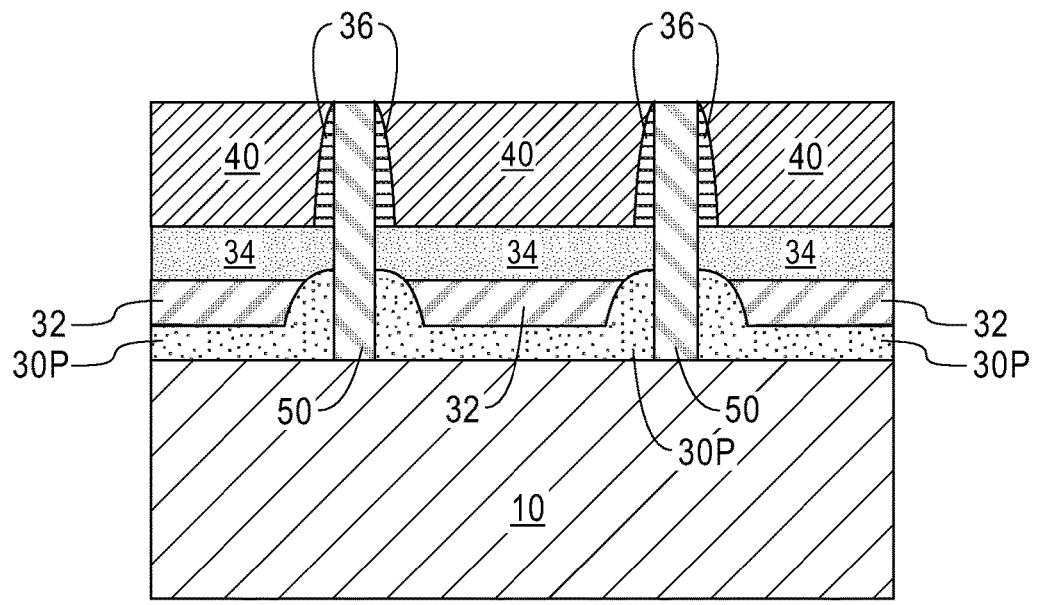
FIG. 9 is a cross-sectional view of the exemplary semiconductor structure of FIG. 8 after forming a Group III-V compound semiconductor nanowire within each cavity.

Referring now to FIG. 9, there is illustrated the exemplary semiconductor structure of FIG. 8 after forming a Group III-V compound semiconductor nanowire 50 from each exposed surface of the semiconductor substrate portion 10 and within each cavity 42. The term "III-V compound semiconductor" as used in conjunction with the Group III-V compound semiconductor nanowire 50 denotes a semiconductor material that has semiconductor properties and includes at least one element from Group III (i.e., B, Al, Ga, and/or In) of the Periodic Table of Elements and at least one element from Group V (i.e., N, P, As, Sb and/or Bi) of the Periodic Table of Elements. The range of possible formulae is quite broad because the elements can form binary compound semiconductors, tertiary compound semiconductors and even quaternary compound semiconductors. In one embodiment of the present application, each Group III-V compound semiconductor nanowire 50 may include InAs, GaAs, InP or InGaAs. While the preferred semiconductor materials that can be used in each Group III-V compound semiconductor nanowire 50 are Group III-V compound semiconductor materials, other semiconductor materials such as Group II-VI or Group IV materials are also possible, The Group III-V compound semiconductor nanowires 50 may be formed by a selective epitaxial growth process including molecular beam epitaxy (MBE) or metal-organic CVD (MOCVD). The term "epitaxial growth" refers to the growth of a semiconductor material layer on a deposition surface of a semiconductor material, in which the semiconductor material layer being grown assumes the same crystalline characteristics as the semiconductor material of the deposition surface. During the selective epitaxial growth process, the III-V compound semiconductor material grows only from exposed semiconductor surfaces, i.e., the exposed surface of the semiconductor substrate portion 10, but not on dielectric surfaces such as surfaces of the sacrificial material portion 30P, the insulator layer 32, the sacrificial gate layer 34, the sacrificial spacer 36 and the ILD layer 40. The selective epitaxial growth process is continued until the topmost surface of each Group III-V compound semiconductor nanowire 50 is coplanar with the topmost surface of the ILD layer 40. Since an epitaxial growth process is used in forming each Group III-V compound semiconductor nanowire 50, each Group III-V compound semiconductor nanowire 50 has a same crystalline orientation as the underlying semiconductor substrate portion 10. In one embodiment, each Group III-V compound semiconductor nanowire 50 has a (111) crystalline orientation.

It should be noted that the processing steps described above for the formation of Group III-V compound semiconductor nanowires 50 can be performed to replace a first subset of Group IV semiconductor nanowires 20 in the structure for formation of n-type FETs, while a second subset of Group IV semiconductor nanowires 20 remains in the structure for formation of p-type FETs. The first subset of Group IV semiconductor nanowires 20 are also referred to as sacrificial semiconductor nanowires. Furthermore, the processing steps described above in FIGS. 8-9 for replacing Group IV semiconductor nanowires 20 with Group III-V compound semiconductor nanowires 50 can be performed after bottom and top source/drain regions for p-type FETs have been formed by performing processing steps described below for the formation of bottom and top source/drain regions for n-type FETs. As a result, the high temperature source/drain epitaxy process performed for formation of source/drain regions for p-type FETs does not adversely affect Group III-V compound semiconductor nanowire 50.

Figure 10:
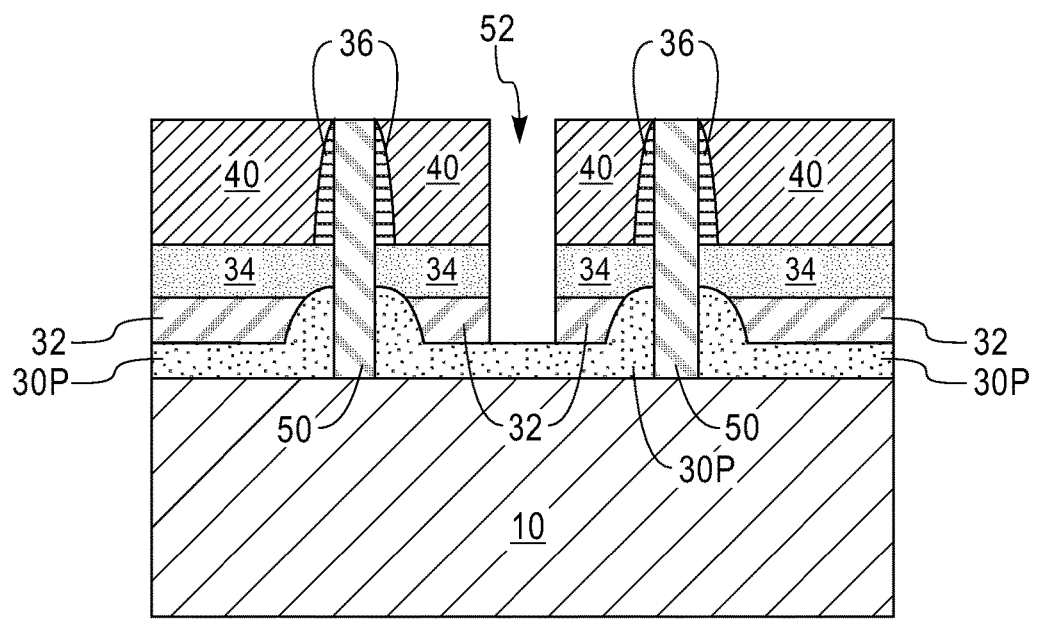
FIG. 10 is a cross-sectional view of the exemplary semiconductor structure of FIG. 9 after forming a first opening extending through the ILD layer, the sacrificial gate layer and the insulator layer to expose a surface of the sacrificial material portion.

Referring now to FIG. 10, there is illustrated the exemplary semiconductor structure of FIG. 9 after forming a first opening 52 extending through the ILD layer 40, the sacrificial gate layer 34 and the insulator layer 32. The first opening 52 exposes a surface of the sacrificial material portion 32. The first opening 52 can be formed by applying a photoresist layer (not shown) over the ILD layer 40, each Group III-V compound semiconductor nanowire 50 and each sacrificial spacer 36, and then lithographically patterning the photoresist layer to form an opening therein. The pattern in the photoresist layer is transferred into the ILD layer 40, the sacrificial gate layer 34 and the insulator layer 32 to form the first opening 52. An anisotropic etch such as RIE may be performed to remove portions of the ILD layer 40, the sacrificial gate layer 34 and the insulator layer 32 that are not covered by the patterned photoresist layer. After forming the first opening 52, the patterned photoresist layer can be removed, for example, by ashing.

Figure 11:
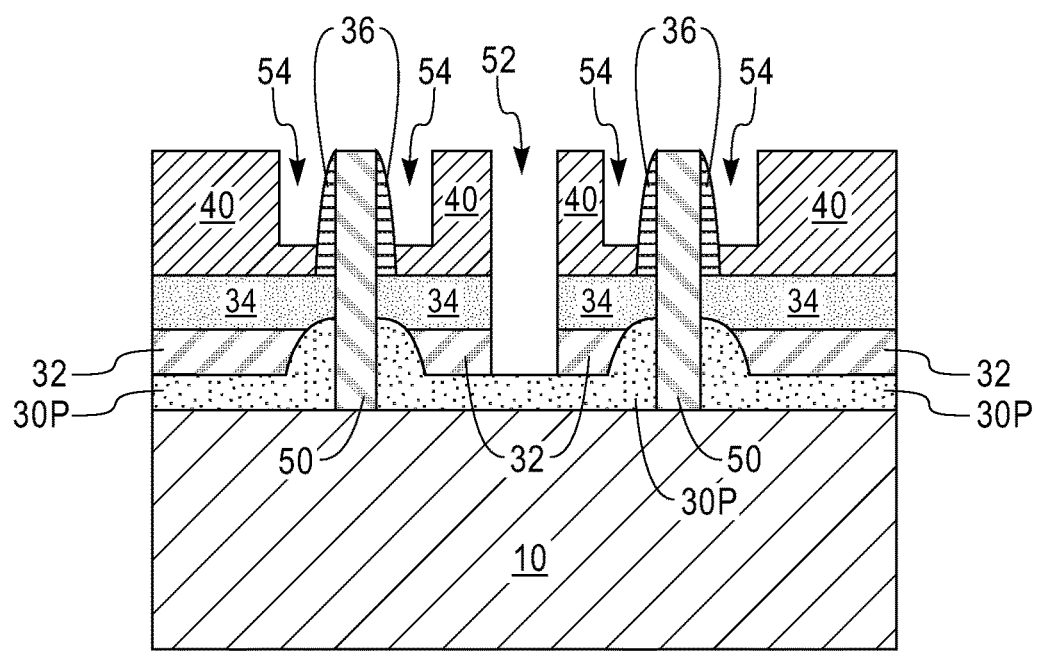
FIG. 11 is a cross-sectional view of the exemplary semiconductor structure of FIG. 10 after forming a second opening within the ILD layer to expose at least a portion of each sacrificial spacer.

Referring now to FIG. 11, there is illustrated the exemplary semiconductor structure of FIG. 10 after removing a portion of the ILD layer 40 that surrounds each sacrificial spacer 36 to provide a second opening 54 exposing at least a portion of each sacrificial spacer 36. Each second opening 54 can be formed by applying a photoresist layer over (not shown) over the ILD layer 40, each Group III-V compound semiconductor nanowire 50 and each sacrificial spacer 36, and then lithographically patterning the photoresist layer to form openings therein. The pattern in the photoresist layer is transferred into the ILD layer 40 to form each second opening 54. An anisotropic etch such as RIE may be performed to remove portions of the ILD layer 40 that are not covered by the patterned photoresist layer. After forming each second opening 54, the patterned photoresist layer can be removed, for example, by ashing.

Figure 12:
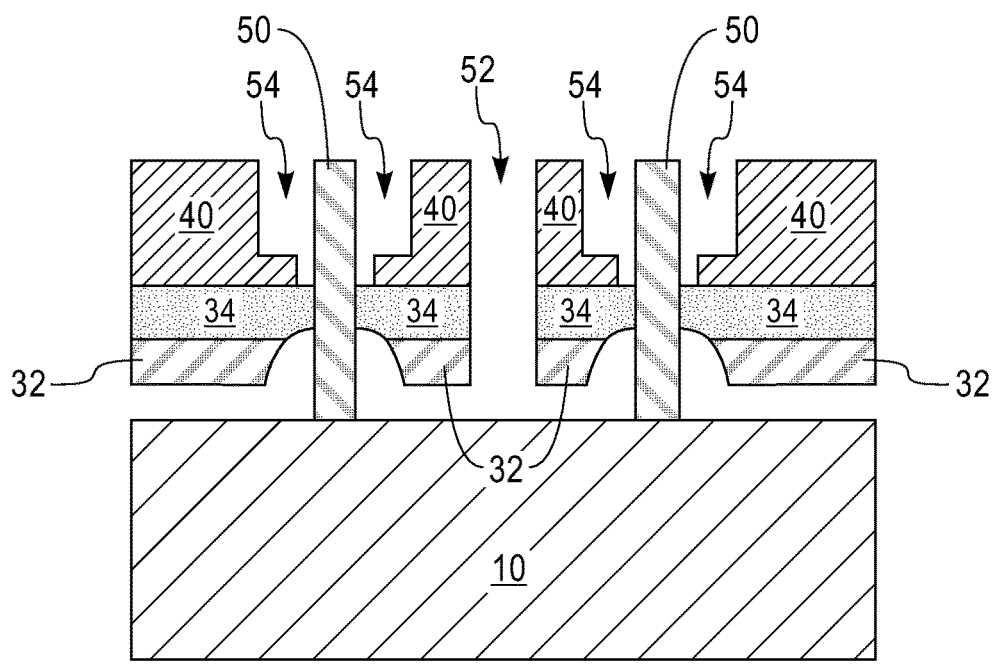
FIG. 12 is a cross-sectional view of the exemplary semiconductor structure of FIG. 11 after removing the sacrificial material portion and each sacrificial spacer.

Referring now to FIG. 12, there is illustrated the exemplary semiconductor structure of FIG. 11 after removing the sacrificial material portion 30P and each sacrificial spacer 36 from the structure through the first opening 52 and each second opening 54, respectively. The sacrificial material portion 30P and each sacrificial spacer 36 can be removed by an isotropic etch that removes dielectric materials that provide the sacrificial material portion 30P and each sacrificial spacer 36 selective to the III-V compound semiconductor material that provides each Group III-V compound semiconductor nanowire 50 and the dielectric materials that provides the ILD layer 40, the sacrificial gate layer 34 and the insulator layer 32. In one embodiment, the removal of the sacrificial material portion 30P and each sacrificial spacer 36 can be performed by a wet etch or a dry isotropic etch using etchant selective to the insulator layer 32, the sacrificial gate layer 34 and each Group III-V compound semiconductor nanowire 50. The removal of the sacrificial material portion 30P exposes the topmost surface the semiconductor substrate portion 10 and sidewall surfaces of a bottom portion of each Group III-V compound semiconductor nanowire 50 that are previously covered by the sacrificial material portion 30P, while the removal of each sacrificial spacer 36 exposes sidewall surfaces of a top portion of each Group III-V compound semiconductor nanowire 50 that are previously covered by each sacrificial spacer 36.

Figure 13:
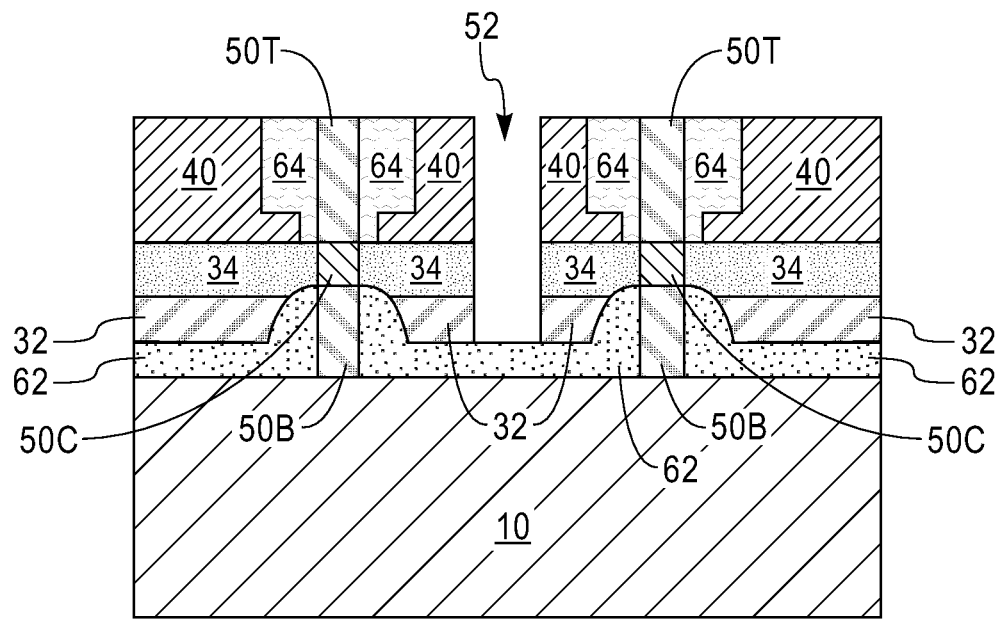
FIG. 13 is a cross-sectional view of the exemplary semiconductor structure of FIG. 12 after forming a first epitaxial semiconductor region within an area previously occupied by the sacrificial material portion and a second epitaxial semiconductor region within each area previously occupied by each sacrificial spacer and each second opening.

Referring now to FIG. 13, there is illustrated the exemplary semiconductor structure of FIG. 12 after forming a first epitaxial semiconductor region 62 within an area previously occupied by the sacrificial material portion 30P and a second epitaxial semiconductor region 64 within an area previously occupied by each sacrificial spacer 36 and each second opening 54. The first and second epitaxial semiconductor regions 62, 64 may be composed a III-V compound semiconductor including, but not limited to, InGaAs and InAs. In addition to including a semiconductor material, the first and second epitaxial semiconductor regions 62, 64 also include an n-type. In one embodiment, each of the first and second epitaxial semiconductor regions 62, 64 may be composed of phosphorus doped InGaAs or InAs suitable for n-type FETs. Other n-type dopants may also be used depending on the design requirements of the n-type FETs.

The first and second epitaxial semiconductor regions 62, 64 can be formed utilizing a selective epitaxial growth process. During the selective epitaxial growth, the semiconductor material that provides the first and second epitaxial semiconductor regions 62, 64 grows only from exposed semiconductor surfaces such as the top surface the semiconductor substrate portion 10 and sidewall surfaces of the exposed bottom and top portions of each Group III-V compound semiconductor nanowire 50, but does not grow on dielectric surfaces such as surfaces of the ILD layer 40, the sacrificial gate layer 34 and the insulator layer 32. The dopant can be provided during the epitaxial growth process by in-situ doping, or after epitaxial growth process by ion implantation or gas phase doping. The epitaxial growth process can be continued until the first epitaxial semiconductor region 62 merges adjacent III-V compound semiconductor nanowires 50. After epitaxial growth, a planarization process such as, for example, CMP may be performed to remove deposited semiconductor material from top of the ILD layer 40 and each Group III-V compound semiconductor nanowire 50 such that the topmost surface of each second epitaxial semiconductor region 64 is coplanar with the topmost surface of the ILD layer 40.

The dopant in the first and second epitaxial semiconductor regions 62, 64 can be activated for example, by a rapid thermal anneal process. In some embodiments of the present application, the annealing may result in a lateral diffusion of dopant into the bottom and top portions of each Group III-V compound semiconductor nanowire 50 to provide a first doped region 50B within the bottom portion of each Group III-V compound semiconductor nanowire 50 contacting the first epitaxial semiconductor region 62 and a second doped region 50T within the top portion of each Group III-V compound semiconductor nanowire 50 contacting each second epitaxial semiconductor region 64. Each non-doped region of each Group III-V compound semiconductor nanowire 50 that is located between the first doped region 50B and the second doped region 50T constitutes a channel region 50C for an n-type FET. Each first doped region 50B and the first epitaxial semiconductor region 62 together constitute a bottom source/drain region for the n-type FET. Each second doped region 50T and each second epitaxial semiconductor region 64 together constitute a top source/drain region for the n-type FET.

Figure 14:
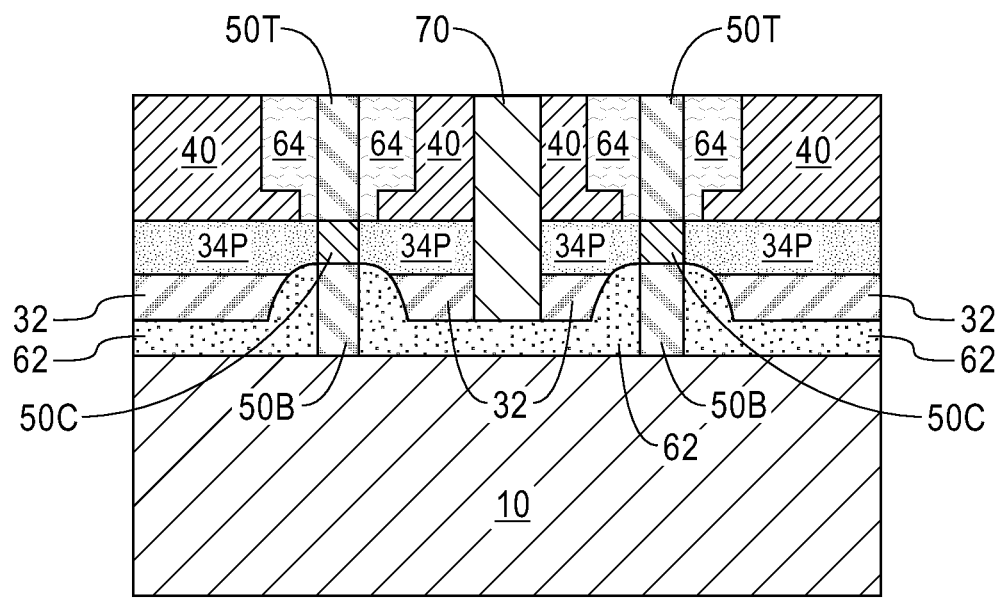
FIG. 14 is a cross-sectional view of the exemplary semiconductor structure of FIG. 13 after forming a dielectric fill portion within the first opening to completely fill the first opening.

Referring now to FIG. 14, there is illustrated the exemplary semiconductor structure of FIG. 13 after forming a dielectric fill portion 70 within the first opening 52 to completely fill the first opening 52. The dielectric fill portion 70 divides the sacrificial gate layer 34 into sacrificial gate structures 34P. Each sacrificial gate structure 34P laterally surrounds a channel region 50C of each Group III-V compound semiconductor nanowire 50.

The dielectric fill portion 70 can be formed by depositing a dielectric material in the first opening 52 using, for example, CVD, PVD or spin coating. The deposited dielectric material can be subsequently planarized, for example, by CMP and/or a recess etch using the ILD layer 40 as a polishing and/or an etch stop to provide the dielectric fill portion 70. After planarization, the dielectric fill portion 70 has a topmost surface coplanar with the topmost surface of the ILD layer 40.

The dielectric material that provides the dielectric fill portion 70 may be the same as, or different from, the dielectric material that provides the ILD layer 40. For example, the dielectric fill portion 70 may include a low-k dielectric material such as boron nitride, silicon carbon boron nitride or a low deposition temperature oxide. In one embodiment, the dielectric fill portion 70 may be made of a same dielectric material as that provides each of the ILD layer 40 and the insulator layer 32, so that the dielectric fill portion 70 is indistinguishable from the ILD layer 40 and the insulator layer 32 after deposition.

Figure 15:
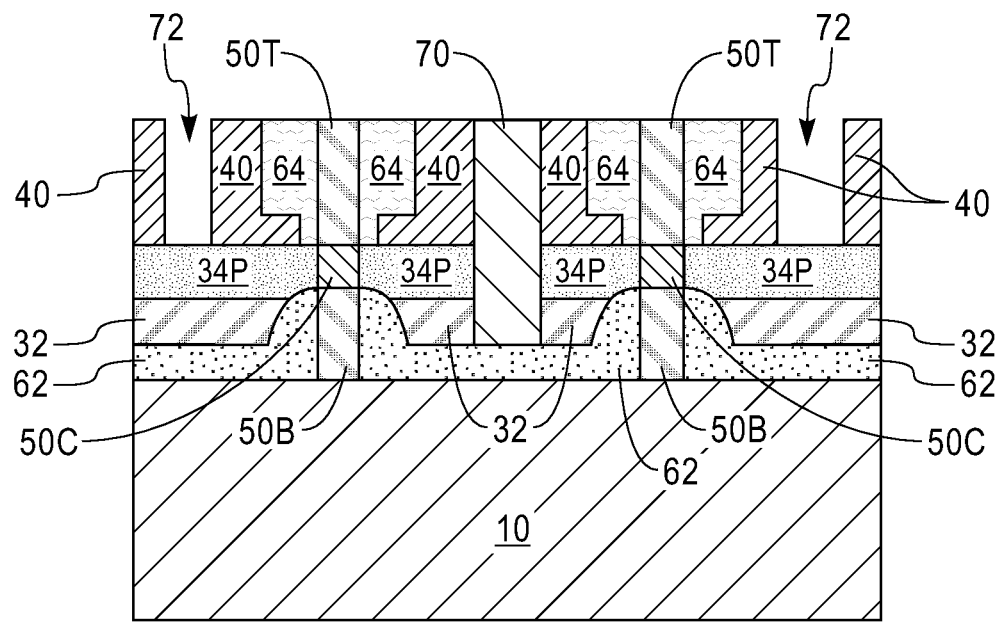
FIG. 15 is a cross-sectional view of the exemplary semiconductor structure of FIG. 14 after forming an opening extending through the ILD layer to expose a portion of each sacrificial gate structure.

Referring now to FIG. 15, there is illustrated the exemplary semiconductor structure of FIG. 14 after forming an opening 72 extending through the ILD layer 40 to expose a portion of each sacrificial gate structure 34P. Each opening 72 can be formed by applying a photoresist layer over (not shown) over the ILD layer 40, each top source/drain region (64, 50T) and the dielectric fill portion 70, and then lithographically patterning the photoresist layer to form openings therein. The pattern in the photoresist layer is transferred into the ILD layer 40 to form each opening 72. An anisotropic etch such as RIE may be performed to remove portions of the ILD layer 40 that are not covered by the patterned photoresist layer. After forming each opening 72, the patterned photoresist layer can be removed, for example, by ashing.

Figure 16:
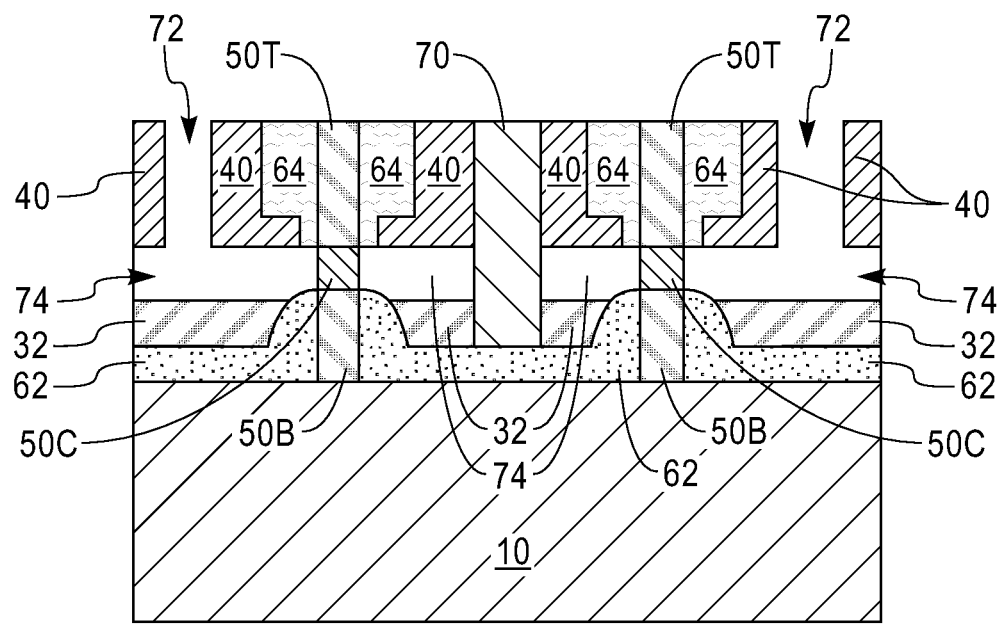
FIG. 16 is a cross-sectional view of the exemplary semiconductor structure of FIG. 15 after removing each sacrificial gate structure to provide a gate cavity.

Referring now to FIG. 16, there is illustrated the exemplary semiconductor structure of FIG. 15 after removing each sacrificial gate structure 34P. The removal of each sacrificial gate structure 34P can be performed by an isotropic etch such as a dry etch or a wet etch. The removal of each sacrificial gate structure 34P provides a gate cavity 74 exposing sidewalls of a channel region 50C within each Group III-V compound semiconductor nanowire 50.

Figure 17:
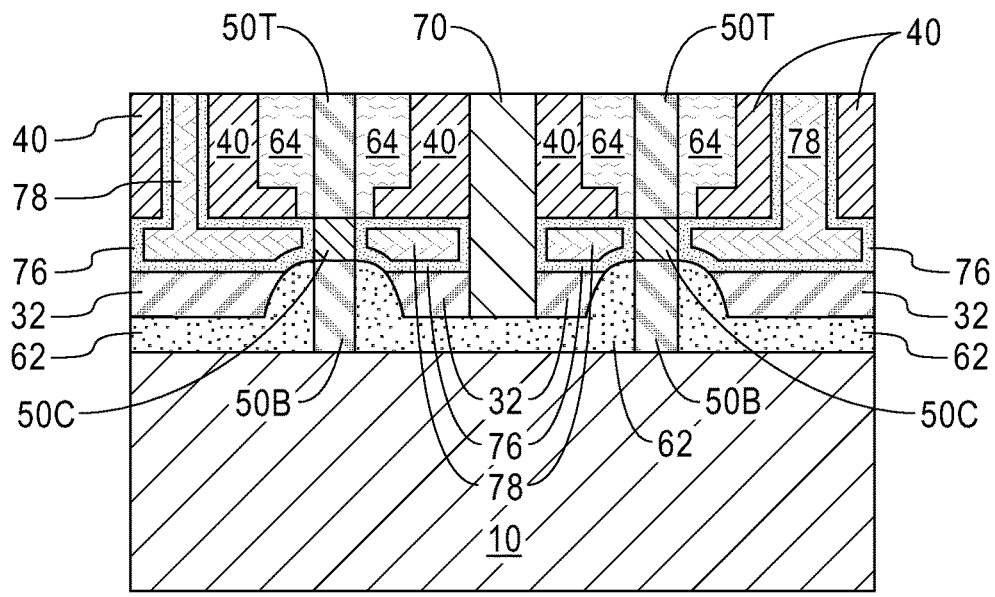
FIG. 17 is a cross-sectional view of the exemplary semiconductor structure of FIG. 16 after forming a functional gate structure.

Referring now to FIG. 17, there is illustrated the exemplary semiconductor structure of FIG. 16 after forming a functional gate structure within each opening 72 and each gate cavity 74. The functional gate structure laterally surrounds a channel region 50C within each Group III-V compound semiconductor nanowire 50. Each functional gate structure includes a gate dielectric 76 present on exposed surfaces of the channel region 50C within each Group III-V compound semiconductor nanowire 50, the first and second epitaxial semiconductor regions 62, 64, the insulator layer 32, the ILD layer 40 and the dielectric fill portion 70, and a gate electrode 78 located over the gate dielectric 76.

The gate dielectric 76 can include a high-k dielectric material having a dielectric constant greater than silicon oxide. Exemplary high-k dielectric materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric comprising different gate dielectric materials, e.g. silicon oxide, and a high-k gate dielectric material can be formed.

The gate dielectric 76 can be formed by any deposition technique including, for example, CVD, PECVD, PVD, and ALD. The thickness of the gate dielectric 76 can be from 1 nm to 10 nm, although lesser and greater thicknesses can also be employed.

After providing the gate dielectric 76, the gate electrode 78 can be formed atop the gate dielectric 72 and filling the remaining space of each opening 72 and each gate cavity 74. The gate electrode 78 can include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate electrode 78 can be formed utilizing a deposition process including, for example, CVD, PECVD, PVD, ALD and other like deposition processes. When a metal silicide is formed, a conventional silicidation process is employed.

Figure 18:
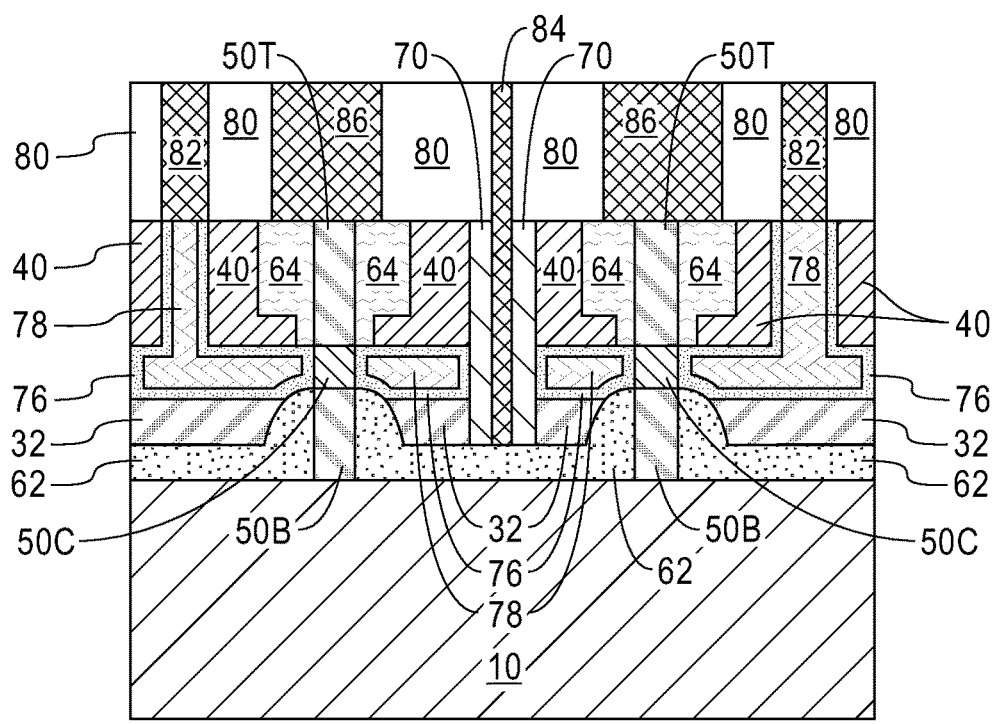
FIG. 18 is a cross-sectional view of the exemplary semiconductor structure of FIG. 17 after forming a contact level dielectric layer and forming various contact structures.

Vertical nanowire FETs are thus formed. Each vertical nanowire FET includes a Group III-V compound semiconductor nanowire 50 extending upwards from a semiconductor substrate portion 10, a bottom source/drain region including a first doped region 50B located within a bottom portion of the Group III-V compound semiconductor nanowire 50 and a first epitaxial semiconductor region 62 having a vertical portion contacting sidewalls of the first doped region 50B, a top source/drain region including a second doped region 50T located within a top portion of the Group III-V compound semiconductor nanowire 50 and a second epitaxial semiconductor region 64 contacting sidewalls of the second doped region 50, a channel region 50C located between the first doped region 50B and the second doped region 50T, and a functional gate structure (76, 78) having a horizontal portion laterally contacting the channel region 50C and a vertical portion extending upwards from the horizontal portion. The first epitaxial semiconductor region 62 merges adjacent III-V compound semiconductor nanowires 50 such that the bottom source/drain region (62, 50B) serves as a common bottom source/drain region for adjacent vertical FETs Referring now to FIG. 18, there is illustrated the exemplary semiconductor structure of FIG. 17 after forming a contact level dielectric layer 80 over the ILD layer 40, each functional gate structure (76, 78), each top source/drain region (64, 50T) and the dielectric fill portion 70. The contact level dielectric layer 80 may include a dielectric material the same as, or different from, the dielectric material that provides the ILD layer 40. For example, the contact level dielectric layer 80 may include a low-k dielectric material such as boron nitride, silicon carbon boron nitride or a low deposition temperature oxide. The contact level dielectric layer 80 may be formed, for example, by CVD or spin-coating. The contact level dielectric layer 80 may be self-planarizing, or the topmost surface of the contact level dielectric layer 80 can be planarized, for example, by CMP. In one embodiment, the planarized topmost surface of the contact level dielectric layer 80 is located above the topmost surface of the ILD layer 40.

Subsequently, various contact structures are formed. The contact structures include a gate contact structure 82 extending through the contact level dielectric layer 80 to form contact with a vertical portion of each functional gate structure (76, 78), a bottom source/drain contact structure 84 extending through the contact level dielectric layer 80 and the dielectric fill portion 70 to form contact with the first epitaxial semiconductor region 62 of the bottom source/drain region (62, 50T), and a top source/drain contact structure 86 extending through the contact level dielectric layer 80 to form contact with each top source/drain region (64, 50T). The gate, bottom source/drain and top source/drain contact structures 82, 84, 86 can be formed by formation of contact openings (not shown) within the dielectric material components including the contact level dielectric layer 80 and dielectric fill portion 70 utilizing a combination of lithographic patterning and anisotropic etch followed by deposition of a conductive material (e.g., copper) and planarization that removes an excess portions of the conductive material from above the topmost surface of the contact level dielectric layer 80. Optionally, contact liners (not shown) may be formed on the sidewalls and bottoms surfaces of the contact openings before filling the contact openings with the conductive material. The contact liners may include TiN.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A semiconductor structure comprising:
   a semiconductor nanowire extending upwards from a semiconductor substrate portion;
   a bottom source/drain region including a first doped region located within a bottom portion of the semiconductor nanowire and a first epitaxial semiconductor region having a horizontal portion present on the semiconductor substrate portion and a vertical portion present on sidewalls of the first doped region;
   a top source/drain region including a second doped region located within a top portion of the semiconductor nanowire and a second epitaxial semiconductor region present on sidewalls of the second doped region;
   a channel region located within the semiconductor nanowire and between the first doped region and the second doped region; and
   a functional gate structure laterally surrounding the channel region.

2. The semiconductor structure of claim 1, wherein the functional gate structure comprises a horizontal portion contacting sidewalls of the channel region and a vertical portion extending upwards from the horizontal portion.

3. The semiconductor structure of claim 2, wherein the horizontal portion of the functional gate structure vertically contacts the first epitaxial semiconductor region and second epitaxial semiconductor region.

4. The semiconductor structure of claim 2, further comprising an interlevel dielectric (ILD) layer located over the horizontal portion of the functional gate structure and laterally surrounding the vertical portion of the functional gate structure and the top source/drain region.

5. The semiconductor structure of claim 4, wherein a topmost surface of the vertical portion of the functional gate structure is coplanar with a topmost surface of the ILD layer.

6. The semiconductor structure of claim 1, wherein the functional gate structure comprises a gate dielectric and a gate electrode surrounded by the gate dielectric.

7. The semiconductor structure of claim 1, further comprising an insulator layer located between the functional gate structure and the first epitaxial semiconductor region, wherein the insulator layer has a topmost surface coplanar with a topmost surface of the vertical portion of the first epitaxial semiconductor region.

8. The semiconductor structure of claim 1, wherein the semiconductor nanowire comprises a Group III-V compound semiconductor material.

9. The semiconductor structure of claim 1, wherein the semiconductor substrate portion comprises Si.

10. The semiconductor structure of claim 1, further comprising another semiconductor nanowire located in a different region of the semiconductor substrate portion, wherein the first epitaxial semiconductor region merges the semiconductor nanowire and the another semiconductor nanowire.

11. A method of forming a semiconductor structure comprising:
    forming a sacrificial semiconductor nanowire extending upwards from a semiconductor substrate portion;
    forming a sacrificial material layer over physically exposed surfaces of the sacrificial semiconductor nanowire and the semiconductor substrate portion;
    forming an insulator layer over the sacrificial material layer, wherein the insulator layer has a topmost surface located below a topmost surface of the sacrificial semiconductor nanowire;
    removing portions of the sacrificial material layer that are not covered by the insulator layer to provide a sacrificial material portion laterally surrounding a bottom portion of the sacrificial semiconductor nanowire;
    forming a sacrificial gate layer over the insulator layer and the sacrificial material portion;
    forming a sacrificial spacer on sidewalls of a top portion the sacrificial semiconductor nanowire that is not covered by the sacrificial gate layer and the sacrificial material layer;
    forming an interlevel dielectric (ILD) layer over the sacrificial gate layer, wherein the ILD layer laterally surrounds the sacrificial spacer;
    replacing the sacrificial semiconductor nanowire with a semiconductor nanowire;
    removing the sacrificial material portion and the sacrificial spacer to expose sidewalls of the bottom portion and sidewalls of the top portion of the semiconductor nanowire;
    forming a first epitaxial semiconductor region laterally surrounding the sidewalls of the bottom portion of the semiconductor nanowire and a second epitaxial semiconductor region laterally surrounding the sidewalls of the top portion of the semiconductor nanowire;

removing the sacrificial gate layer to provide a gate cavity exposing a channel region of the semiconductor nanowire; and forming a functional gate structure within the gate cavity.

12. The method of claim 11, wherein the replacing the sacrificial semiconductor nanowire with the semiconductor nanowire comprises:

removing the sacrificial semiconductor nanowire to provide a cavity exposing a surface of the semiconductor material portion;

epitaxially growing a semiconductor material from the surface of the semiconductor material portion and within the cavity.

13. The method of claim 11, wherein the semiconductor material portion comprises Si.

14. The method of claim 11, wherein the removing the sacrificial material portion and the sacrificial spacer comprises:

forming a first opening extending through the ILD layer, the sacrificial gate layer and the insulator layer to expose a portion of the sacrificial material portion;

forming a second opening within the ILD layer to expose at least a portion of the sacrificial spacer; and removing the sacrificial material portion and the sacrificial spacer.

15. The method of claim 14, wherein the first epitaxial semiconductor region is located within an area previously occupied by the sacrificial material portion, and the second epitaxial semiconductor region is located within an area previously occupied by the sacrificial spacer and the second opening.

16. The method of claim 15, further comprising forming a dielectric fill portion within the first opening.

17. The method of claim 11, wherein the removing the sacrificial gate layer comprises:

forming an opening extending through the ILD layer to expose a portion of the sacrificial gate layer; and etching the sacrificial gate layer through the opening, wherein after the removing the sacrificial gate layer, the opening intersects a portion of the gate cavity.

18. The method of claim 17, wherein the forming the functional gate structure comprises forming the functional gate structure within the opening and the gate cavity.

19. The method of claim 11, wherein the forming the sacrificial semiconductor nanowire comprises patterning an upper portion of a semiconductor substrate, wherein a remaining portion of the semiconductor substrate underlying the sacrificial semiconductor nanowire constitutes the semiconductor substrate portion.

20. The method of claim 11, further comprising diffusing a dopant in each of the first epitaxial semiconductor region and the second epitaxial semiconductor region into the bottom portion and the top portion of the semiconductor nanowire.

* * * * *